United States Patent
Radke

(10) Patent No.: US 6,701,495 B1
(45) Date of Patent: Mar. 2, 2004

(54) MODEL OF THE CONTACT REGION OF INTEGRATED CIRCUIT RESISTORS

(75) Inventor: Russell E. Radke, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 19 days.

(21) Appl. No.: 10/253,006

(22) Filed: Sep. 23, 2002

(51) Int. Cl.[7] ................................................ G06F 17/50
(52) U.S. Cl. .......................... 716/5; 716/1; 703/13; 703/22; 338/320; 338/321
(58) Field of Search ................. 716/5, 1; 703/13–15, 703/22; 338/320, 321, 333; 257/773, 767, 734; 324/549

(56) References Cited

U.S. PATENT DOCUMENTS

| | | | | |
|---|---|---|---|---|
| 4,721,899 A | * | 1/1988 | Weil ............................ | 324/415 |
| 5,083,183 A | * | 1/1992 | Kobayashi .................... | 257/537 |
| 5,099,148 A | * | 3/1992 | McClure et al. .............. | 326/86 |
| 5,257,005 A | * | 10/1993 | Desroches et al. ........... | 338/325 |
| 5,748,179 A | * | 5/1998 | Ito et al. ...................... | 349/152 |
| 5,872,504 A | * | 2/1999 | Greitschus et al. .......... | 338/320 |
| 5,903,184 A | * | 5/1999 | Hiraga ......................... | 327/546 |
| 5,952,722 A | * | 9/1999 | Watanabe .................... | 257/754 |
| 5,959,360 A | * | 9/1999 | Fu ............................... | 257/773 |
| 6,381,564 B1 | * | 4/2002 | Davis et al. .................. | 703/22 |
| 6,483,152 B1 | * | 11/2002 | Kim ............................ | 257/379 |
| 6,603,172 B1 | * | 8/2003 | Segawa et al. .............. | 257/328 |
| 2003/0160624 A1 | * | 8/2003 | Takemoto et al. ........... | 324/754 |

* cited by examiner

Primary Examiner—Vuthe Siek
(74) Attorney, Agent, or Firm—The Law Offices of William W. Cochran, LLC

(57) ABSTRACT

Accurate models of the contact region of an integrated circuit resistor are created in a single function. The function incorporates many contact geometries into a single function that cannot otherwise be represented by a closed form solution. A method of creating the function uses regression over the simulation results for many combinations of input variables. The function may use the contact resistance, metal trace resistance, and resistive area resistance as inputs to calculate the resistor contact region resistance.

6 Claims, 5 Drawing Sheets

MODEL OF THE CONTACT REGION OF INTEGRATED CIRCUIT RESISTORS

BACKGROUND OF THE INVENTION a. Field of the Invention

The present invention pertains to tools used for analyzing integrated circuits during design and specifically to tools for simulating the contact resistance of resistors in integrated circuits.

b. Description of the Background

Integrated circuits are commonplace in electronics of all sorts since many types of electrical devices can be combined into a single part. These devices may include capacitors, transistors, resistors, and many other devices.

The processes used to fabricate integrated circuits, including the materials and manufacturing steps, are continually being updated and changed. When a new generation of manufacturing processes is planned, it is common to set specific performance characteristics prior to successfully fabricating an integrated circuit using the new manufacturing processes. The purpose of setting the performance characteristics is to allow the design of new integrated circuits to proceed using the planned performance characteristics so that the new designs would be compatible with the new manufacturing processes.

Typically, the new process development and a new integrated circuit design may occur over many months. Some aspects of the performance of a new integrated circuit may not be fully characterized until the manufacturing process is actually executed and tuned. A delay in the characterization of an element may mean that a design may have to be changed after the manufacturing process is tuned and understood. This delay may cause many man-hours of work and may also delay the release of a new product.

The contact resistance between a metal trace and a resistor is an element that has heretofore been poorly estimated during the development of the manufacturing process. It has only been properly characterized after development of the manufacturing process. After the manufacturing process is completed, empirical measurements are taken to determine the resistance of this region, and the design is modified to operate with the empirical measurements.

It would therefore be advantageous to provide a system and method for simulating the contact resistance between a metal trace and a resistor in an integrated circuit that may be used during the design of an integrated circuit. It would be further advantageous to provide a system and method for simulating the contact resistance between a metal trace and a resistor in an integrated circuit that uses manufacturing process performance characteristics as input, so that designs using the simulation could be created that closely match the actual performance of the manufactured integrated circuit.

SUMMARY OF THE INVENTION

The present invention overcomes the disadvantages and limitations of the prior art by providing a system and method that accurately determines the resistance of a contact region of an integrated circuit. The system and method use target process performance specifications so that accurate simulations of the contact region may be made prior to obtaining empirical data, thus making design simulations more accurate for integrated circuits being designed for processes that are still under development. Further, many different geometries of the contact region are handled with the function.

The present invention may therefore comprise a simulation program of the contact region for a resistor of an integrated circuit wherein an array of contacts are used to connect a metal trace to a resistor element comprising: a contact resistance value representing the resistance of the contacts; a metal resistance value representing the resistance of the metal trace; a resistor resistance value representing the resistance of the resistor element; and a function having inputs comprising: the contact resistance, the metal resistance, the resistor resistance, and the number of rows of contacts, the function generated by the process of determining at least two values that define the ranges of resistance for the contact resistance, the metal resistance, and the resistor resistance, calculating the total resistance for each combination of the values of resistance, and performing a regression analysis on the calculated values of the total resistance for the combinations of values of the resistance.

The present invention may further comprise a method of generating a function to represent the resistance of the contact region of an integrated circuit resistor comprising: determining at least two values that define the range of resistance for contact resistance representing the resistance of a contact; determining at least two values that define the range of resistance for metal resistance representing the resistance of a metal trace; determining at least two values that define the range of resistance for resistor resistance representing the resistance of a resistor element; determining at least two different geometries of the contact region; calculating the total resistance for each combination of the values of resistance and the geometries; performing a regression analysis on the calculated values of the total resistance for the combinations of values of the resistance and the geometries; and forming a function from the regression analysis to calculate the total resistance, the function having inputs comprising the resistances and the geometries.

The present invention may further comprise an integrated circuit having been designed with a process comprising: generating a schematic of the integrated circuit comprising at least one resistor, the resistor comprising at least one contact region; performing a simulation of the performance of the integrated circuit using the schematic and using a function to determine the resistance of the contact region, the function having inputs comprising: a contact resistance defining the resistance of a contact within the contact region, a metal resistance defining the resistance of a metal trace, a resistor resistance defining the resistance of the resistive region, and the number of rows of contacts, the function generated by the process of determining at least two values that define the ranges of resistance for the contact resistance, the metal resistance, and the resistor resistance, calculating the total resistance for each combination of the values of resistance, and performing a regression analysis on the calculated values of the total resistance for the combinations of values of the resistance and the number of rows; and changing at least one portion of the schematic based on the simulation.

The advantages of the present invention are that accurate values of the resistance of a contact region are found using a single function for a variety of contact region geometries. Further, the function uses parameters that are known prior to empirically testing a manufacturing process that may be under development. This allows designs to be completed contemporaneously with the development of a manufacturing process.

DETAILED DESCRIPTION OF THE INVENTION

Figure 1:
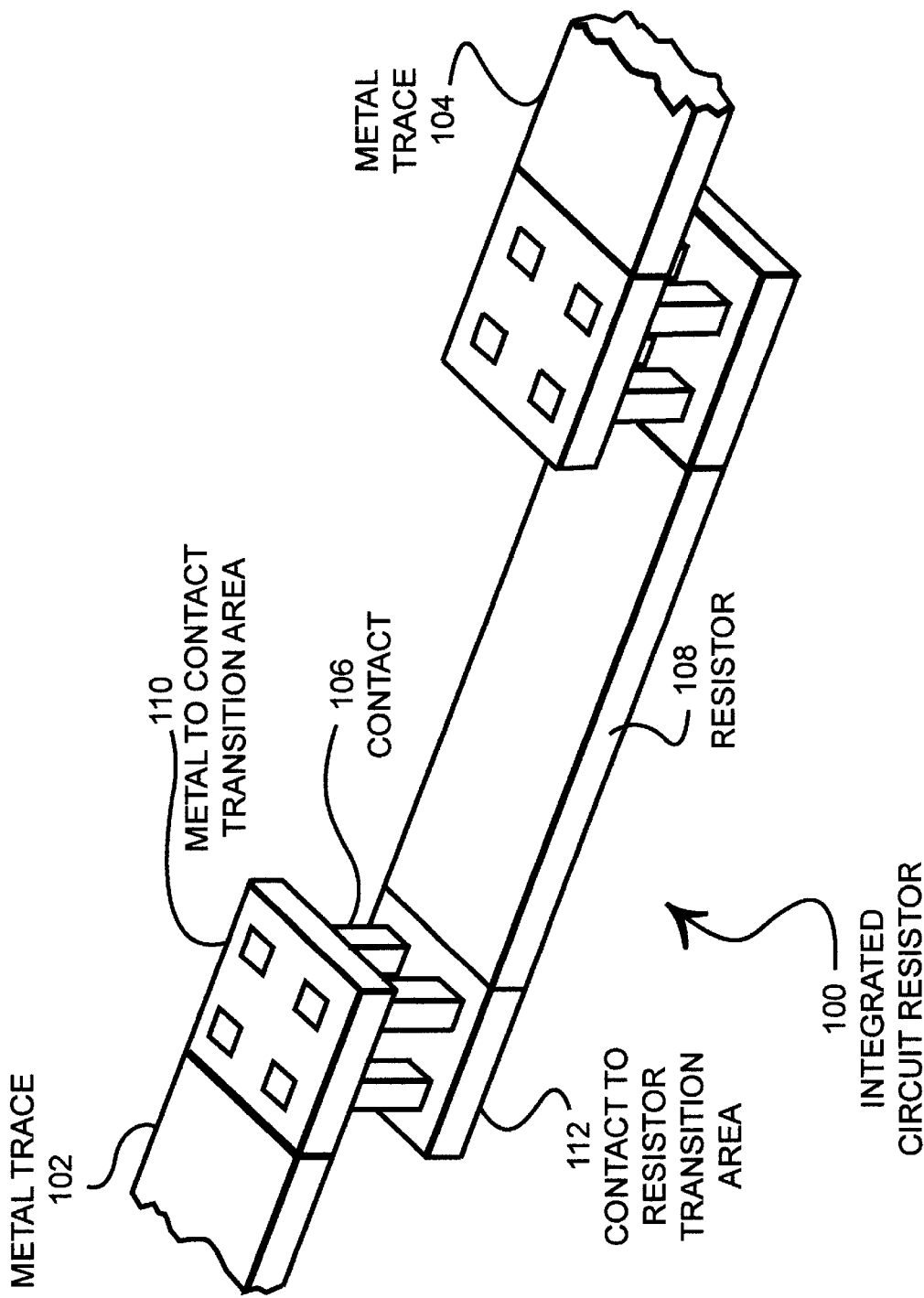
FIG. 1 is an illustration of an integrated circuit resistor.

FIG. 1 illustrates an integrated circuit resistor 100. The input metal trace 102 and output metal trace 104 are low resistivity conductors. The contacts 106 transfer the electrical current to the resistor 108. The resistor 108 is trace within the silicon layer that is specially configured to provide a known resistivity. The metal to contact transition area 110 and contact to resistor transition area 112 are both areas where the geometry of the traces changes the resistance in those areas.

It is common practice to use multiple contacts 106 to transfer current from a metal trace layer 102 to a resistor 108. In some cases, the number of contacts may range from one to ten contacts across the width of the metal trace, and up to ten contacts deep. Many contacts may be used when the traces are carrying high currents.

Figure 2:
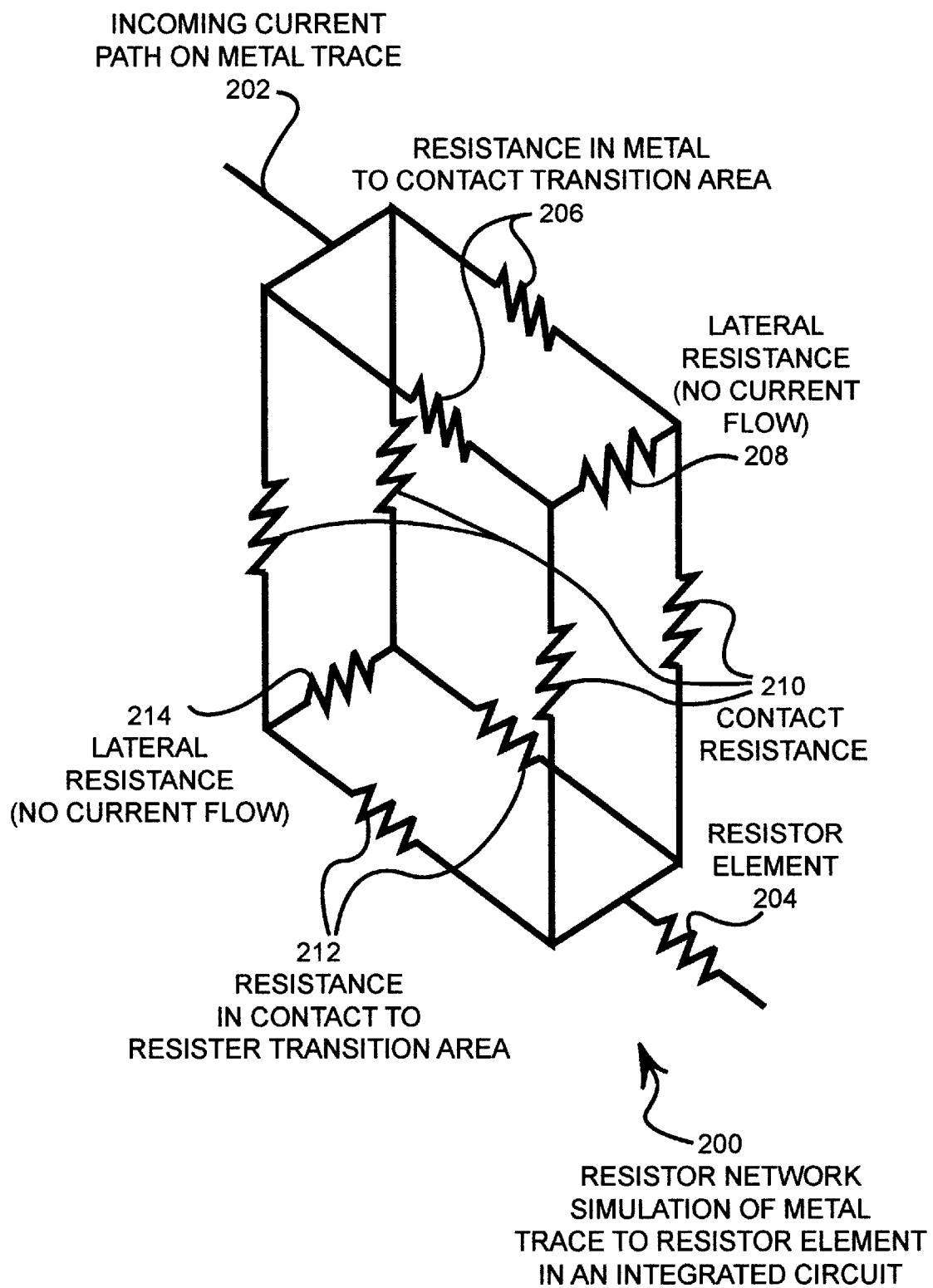
FIG. 2 is an illustration of a resistor network that represents the metal trace to resistor contact region.

FIG. 2 illustrates a resistor network 200 that represents the metal trace to resistor contact region. The incoming current path 202 is connected to a resistor element 204 through a three dimensional network of resistors. The resistance in the metal transition area is shown as resistors 206 and 208. Resistor 208 is the resistance between the two contacts across the width of the trace. If the resistors 206 are equal, there should be no current flow across the resistor 208 and thus the resistor 208 is unnecessary.

Resistors 210 represent the resistance of the individual contacts that pass the current from the metal layer to the resistor. The resistance in the resistance transition area is shown as resistors 212 and 214. As with resistor 208, resistor 214 may be unnecessary for the calculation of the overall resistance.

For resistor contact geometries with different number of vertical contacts, the number of resistors in the network may be different. For example, in a resistor contact area comprising an array of contacts 4 rows deep and 3 columns wide, a total of 12 contact resistors are connected in a network.

Figure 3A:
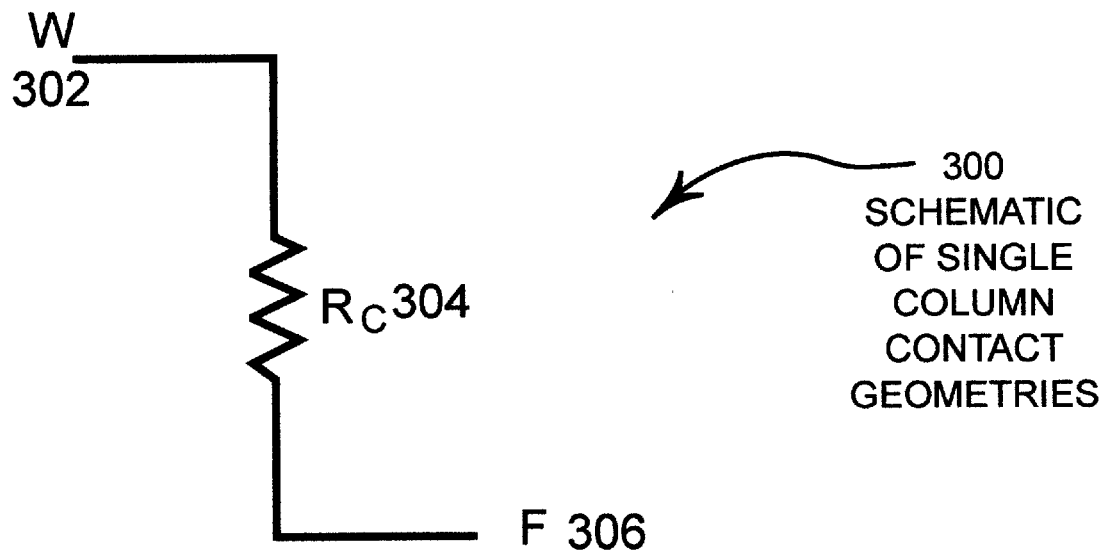
FIG. 3A is an illustration of a schematic of a single row contact geometry.

FIG. 3A illustrates a schematic 300 of a single row contact geometry. The input W 302 passes through the contact resistor Rc 304 to the output F 306. For resistor connections made with one contact, the value Rc 304 would be equal to the contact resistance of a single contact. If the contact array was two contacts wide and one row deep, the value Rc 304 in the schematic would be half of the nominal value, since the contacts are in parallel.

Figure 3B:
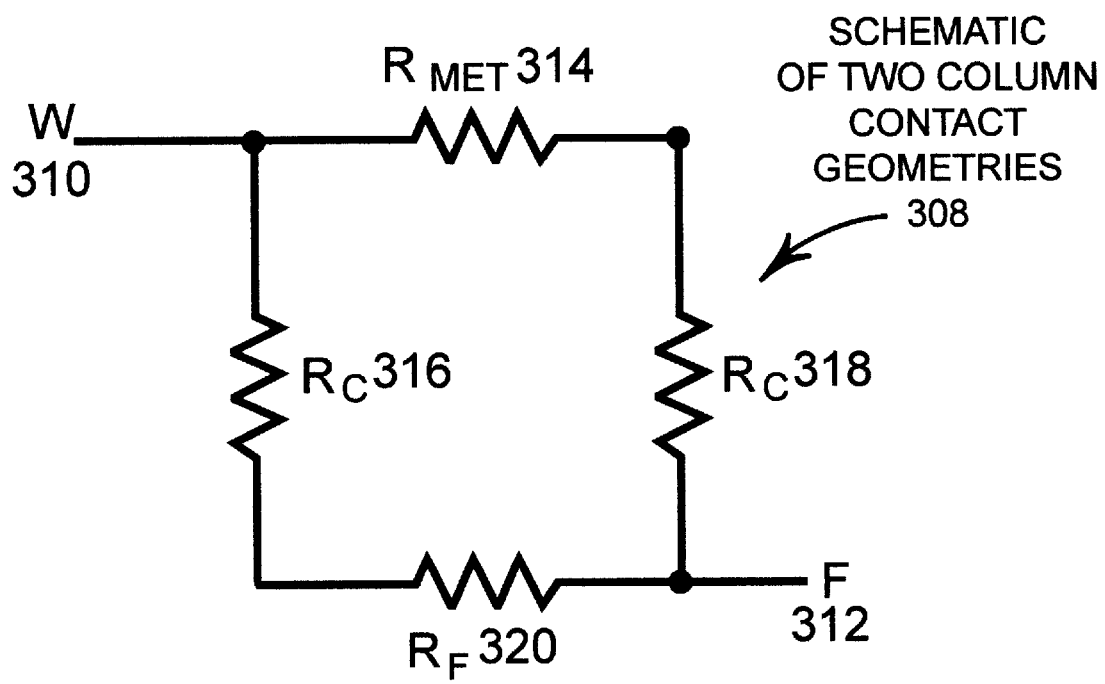
FIG. 3B is an illustration of a schematic of a two row contact geometry.

FIG. 3B illustrates a schematic 308 of a two row contact geometry. The current from input W 310 passes to the output F 312. The resistor Rmet 314 represents the resistance between the columns of contacts Rc 316 and Rc 318. The resistor Rf 320 represents the resistance between the columns in the resistance layer.

Figure 3C:
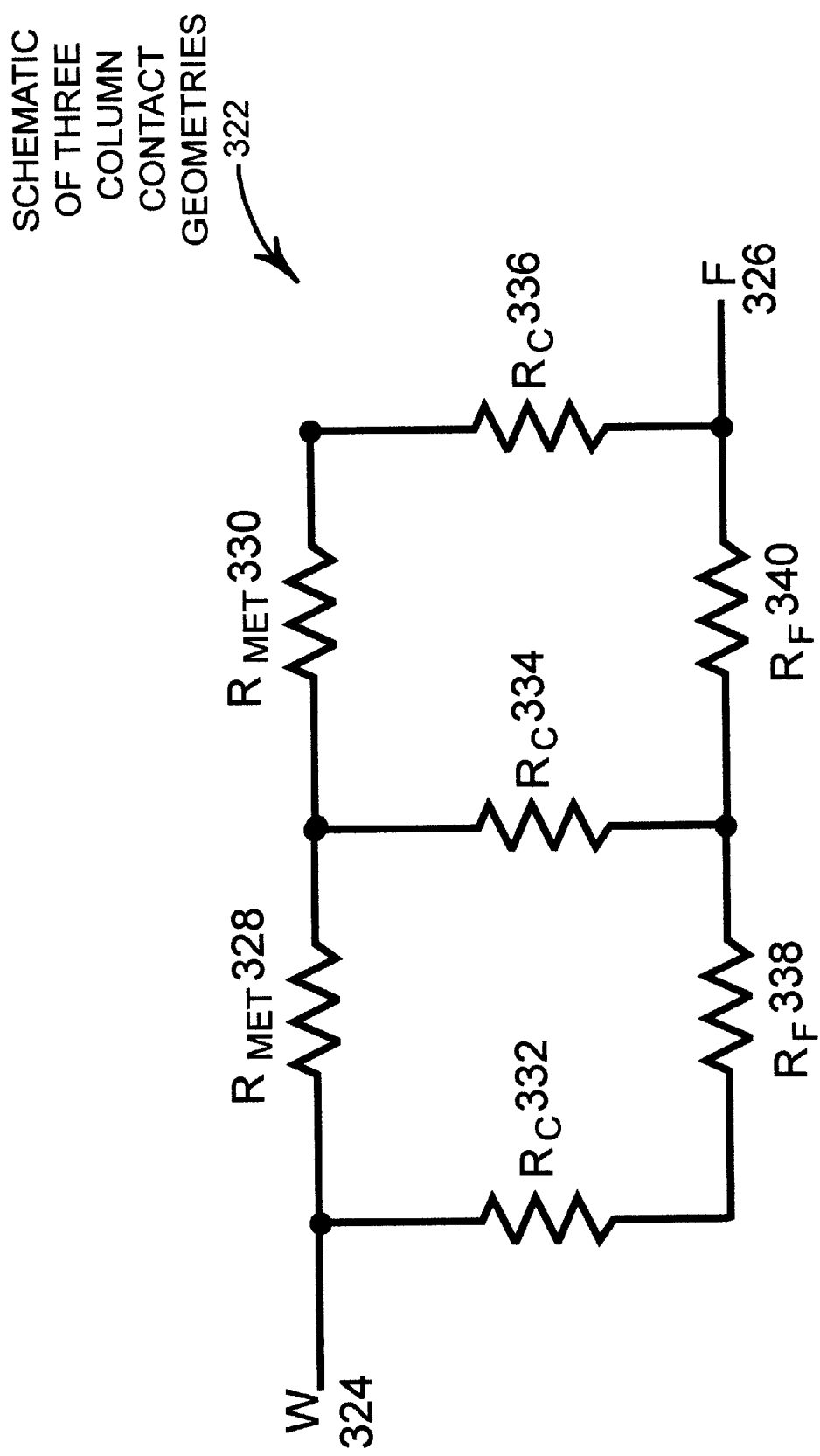
FIG. 3C is an illustration of a schematic of a three row contact geometry.

FIG. 3C illustrates a schematic 322 of a three row contact geometry. The current from input W 324 passes to the output F 326. The resistors Rmet 328 and Rmet 330 represent the resistance between the respective columns of contacts Rc 332, Rc 334, and Rc 336. The resistors Rf 338 and Rf 340 represent the resistance between the columns in the resistance layer.

Those skilled in the arts would appreciate that schematic representations of contact arrays of greater than three rows are similarly constructed.

The equations for the calculation of overall resistance of the various circuits shown in FIGS. 3A, 3B, and 3C are relatively simple. However, each different number of rows of contacts requires a separate equation. A difficulty arises when seeking a single equation or function that can represent all of the various cases of contact geometries.

Simulation is an important tool used in the design of integrated circuits. Simulations are performed many times throughout the design phase of an integrated circuit and require extraordinary computational resources. The faster the simulation can be performed, the faster the design can progress. Further, the amount of data to be maintained at the start of the simulation can become cumbersome. Any reduction in the data maintenance requirements or computational time for a simulation improves the efficiency of the design process.

Figure 4:
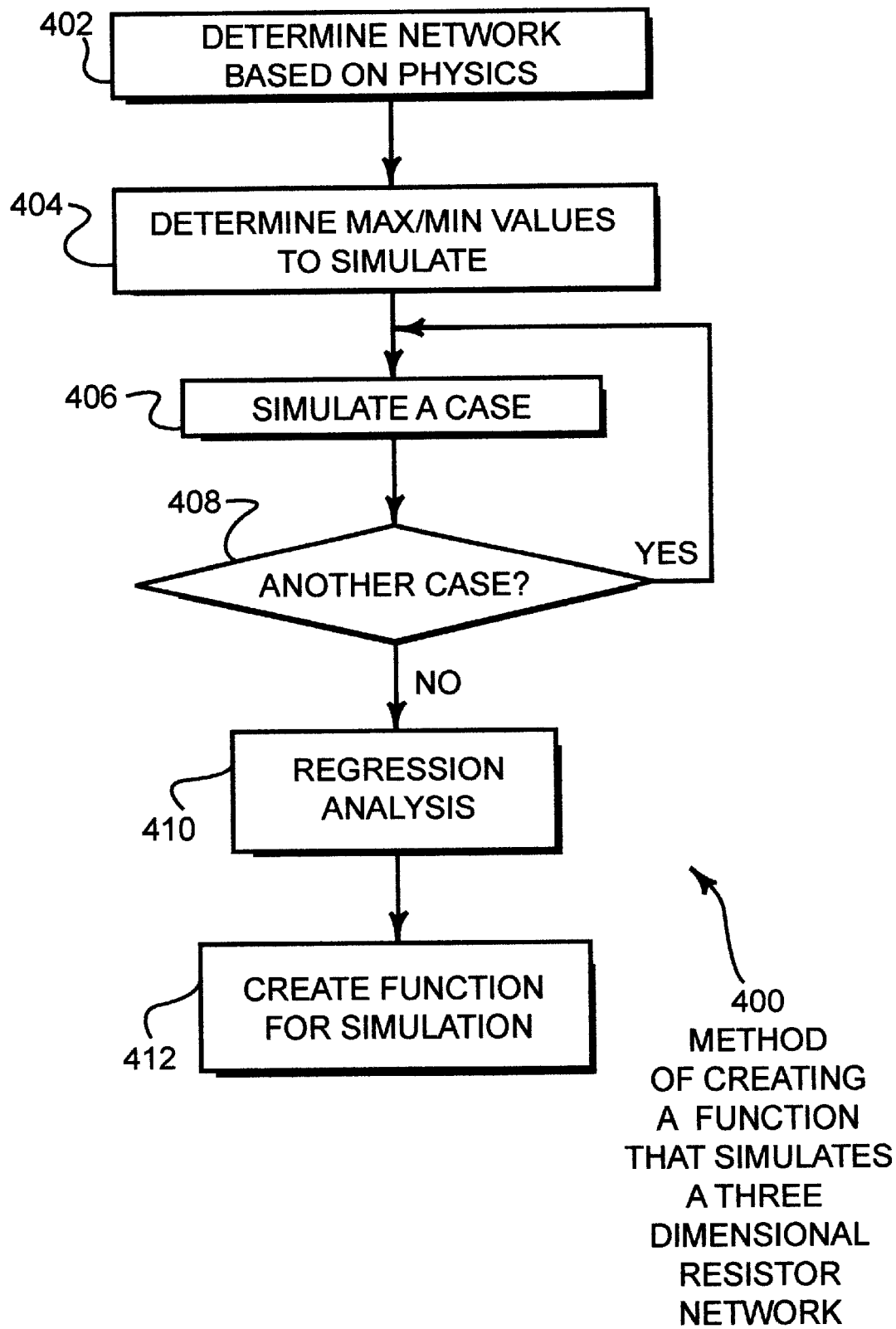
FIG. 4 is an illustration of a work flow diagram of an embodiment of a method of creating a single function to represent a series of contact geometries.

FIG. 4 illustrates a work flow diagram of an embodiment 400 of a method of creating a single function to represent a series of contact geometries. The network is determined based on the physics of the contact geometries in block 402 and maximum and minimum values of each variable are determined in block 404. A single case is simulated in block 406, if more cases need to be simulated in block 408, another case is simulated in block 406. After the simulations are completed in block 408, the results are assimilated and regression analysis is performed in block 410. The results of the regression analysis are used to create a single function for the simulation in block 412.

The embodiment 400 is capable of generating a single function that may have as inputs variables such as Rmet, Rc, Rf, as well as the number of rows and optionally columns. The function is quickly called during a simulation to accurately estimate the contact resistance for any anticipated geometry.

The function has as inputs the variables Rmet, Rc, and Rf. Each of the resistance inputs may be target values that are determined during the development of a new generation of manufacturing processes. For example, the high, low, and median values of the resistance of the metal traces may be determined during the process development and prior to actual fabrication of samples for empirical testing. By being able to use the process development target values as input to the function, accurate models of the contact resistance may be created before any fabrication begins. These models may allow a design for an integrated circuit to proceed and be completed concurrently with the manufacturing process development.

An example will be used to illustrate the process of generating such a function. Those skilled in the art will appreciate that various changes to the process may be incorporated while keeping within the spirit and intent of the present invention.

The simplified circuits such as those shown in FIGS. 3A, 3B, and 3C may be used to represent the physical geometry of the various configurations of the contact region of an integrated circuit resistor. Circuits for every different set of rows may be generated as part of the step 402.

Step 404 of determining the maximum and minimum values to simulate may consist of determining the complete ranges for all of the variables, plus additional intermediate values to aid in the accuracy of the regression.

By way of example, a function will now be created to simulate arrays of contacts from a single contact to an array of 10 rows and 10 columns. For the purposes of example, Rc is nominally between 18 and 6 ohms, Rf is between 7 and 3 ohms, and Rmet is between 0.121 and 0.069 ohms.

In some simulations, the resistance of parallel elements may be combined. For example, when a simulation evaluates a contact array where there are four columns of contacts, the resistor contact, Rc, may be divided by four on account of four resistors in parallel. In order to account for this anomaly of the specific simulation, the effective lower range of the various resistances would be the lower range of the resistance divided by the maximum number of columns of contacts. In the present example, this number would be ten.

Intermediate values of resistances may be used to add more data for the regression analysis. In general, more data for the regression analysis, the more accurately the regression results will track the actual values. However, the increased data means increased computational time. For the present example, the values used for the analysis include the high limit, the low limit, the low limit divided by ten, and one intermediate value. Table 1 represents the values of resistance used in the present example.

TABLE 1

Values Used for Example Regression

| | Rows | Contact Resistance (Rc) | Metal Trace Resistance (Rmet) | Resistor Material Resistance (Rf) |
|---|---|---|---|---|
| Maximum Value | 10 | 18 | 0.121 | 7 |
| Minimum Value | 1 | 6 | 0.06 | 3 |
| Intermediate Point | | 2 | 0.02 | 1 |
| Minimum Value/10 | | 0.6 | 0.069 | 0.3 |

In the present example, the resistance of the contact region for every combination of Rc, Rmet, Rf in the above table will be run for each of the 10 different row configurations. This gives 640 results. Each result will be resultant resistance of the network from the input metal trace to the start of the resistance material after the contact region.

The 640 results may then be analyzed with regression analysis to create a function that has as inputs rows, contact resistance (Rc), metal trace resistance (Rmet), and resistor material resistance (Rf). The result of a second order regression analysis using the data in

TABLE 2

Regression Results for Example

| Term | Reference Designator | Coefficient |
|---|---|---|
| Constant | A | 0.430857 |
| 1/Rows | B | −0.355290 |
| Rc | C | 0.162091 |
| Rf | D | 0.175392 |

TABLE 2-continued

Regression Results for Example

| Term | Reference Designator | Coefficient |
|---|---|---|
| Rmet | E | 2.34699 |
| 1/Rows^2 | F | 0.692969 |
| 1/Rows * Rc | G | 0.129700 |
| 1/Rows * Rf | H | −0.112339 |
| 1/Rows * Rmet | I | −2.36141 |
| Rc^2 | J | −0.00569699 |
| Rc * Rf | K | 0.00468102 |
| Rc * Rmet | L | −0.0738959 |
| Rf^2 | M | −0.0137457 |

In order to calculate the resistance of a contact region, the following formula may be used:

$$Rtotal = A + B/Rows + C*Rc + D*Rf + E*Rmet + F/Rows^2 + G*(Rc/Rows) + H*(Rf/Rows) + I*(Rmet/Rows) + J*Rc^2 + K*Rc*Rf + L*Rc*Rmet + M*Rf^2$$

The single function for calculating the resistance of a contact region replaces ten independent functions that may have been called for the ten different contact geometries. The simplicity of the present function is that only one function need be called for any contact geometry.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A simulation program of the contact region for a resistor of an integrated circuit wherein an array of contacts are used to connect a metal trace to a resistor element comprising:

a contact resistance value representing the resistance of said contacts;

a metal resistance value representing the resistance of said metal trace;

a resistor resistance value representing the resistance of said resistor element; and a function having inputs comprising: said contact resistance, said metal resistance, said resistor resistance, and the number of rows of contacts, said function generated by the process of determining at least two values that define the ranges of resistance for said contact resistance, said metal resistance, and said resistor resistance, calculating the total resistance for each combination of said values of resistance, and performing a regression analysis on the calculated values of said total resistance for said combinations of values of said resistance.

2. The simulation program of claim 1 wherein said ranges of resistance are defined with at least one intermediate point.

3. A method of generating a function to represent the resistance of the contact region of an integrated circuit resistor comprising:

determining at least two values that define the range of resistance for contact resistance representing the resistance of a contact;

determining at least two values that define the range of resistance for metal resistance representing the resistance of a metal trace;

determining at least two values that define the range of resistance for resistor resistance representing the resistance of a resistor element;

determining at least two different geometries of said contact region;

calculating the total resistance for each combination of said values of resistance and said geometries; performing a regression analysis on the calculated values of said total resistance for said combinations of values of said resistance and said geometries; and forming a function from said regression analysis to calculate said total resistance, said function having inputs comprising said resistances and said geometries.

4. The method of claim 3 wherein said ranges of resistance are defined with at least one intermediate point.

5. An integrated circuit having been designed with a process comprising:

generating a schematic of said integrated circuit comprising at least one resistor, said resistor comprising at least one contact region;

performing a simulation of the performance of said integrated circuit using said schematic and using a function to determine the resistance of said contact region, said function having inputs comprising: a contact resistance defining the resistance of a contact within said contact region, a metal resistance defining the resistance of a metal trace, a resistor resistance defining the resistance of the resistive region, and the number of rows of contacts, said function generated by the process of determining at least two values that define the ranges of resistance for said contact resistance, said metal resistance, and said resistor resistance, calculating the total resistance for each combination of said values of resistance, and performing a regression analysis on the calculated values of said total resistance for said combinations of values of said resistance and said number of rows; and changing at least one portion of said schematic based on said simulation.

6. The integrated circuit of claim 5 wherein said ranges of resistance are defined with at least one intermediate point.

* * * * *